US009076776B1

(12) United States Patent
Lim et al.

(10) Patent No.: US 9,076,776 B1
(45) Date of Patent: Jul. 7, 2015

(54) INTEGRATED CIRCUIT PACKAGE WITH STAND-OFF LEGS

(75) Inventors: Ken Beng Lim, Bayan Lepas (MY); Ping Chet Tan, Gelugor (MY)

(73) Assignee: Altera Corporation, San Jose, CA (US)

( * ) Notice: Subject to any disclaimer, the term of this patent is extended or adjusted under 35 U.S.C. 154(b) by 776 days.

(21) Appl. No.: 12/621,749

(22) Filed: Nov. 19, 2009

(51) Int. Cl.
*H01L 23/495* (2006.01)
*H01L 23/02* (2006.01)
*H01L 23/22* (2006.01)
*H01L 23/24* (2006.01)
*H01L 23/48* (2006.01)
*H01L 23/28* (2006.01)
*H01L 21/52* (2006.01)
*H01L 21/56* (2006.01)

(52) U.S. Cl.
CPC ..... *H01L 23/49503* (2013.01); *H01L 2924/152* (2013.01); *H01L 2924/1515* (2013.01); *H01L 2924/151* (2013.01); *H01L 2924/1511* (2013.01); *H01L 2924/18301* (2013.01); *H01L 21/52* (2013.01); *H01L 21/565* (2013.01); *H01L 23/28* (2013.01); *H01L 2924/181* (2013.01); *H01L 2224/48247* (2013.01); *H01L 2924/01029* (2013.01)

(58) Field of Classification Search
CPC .......... H01L 2924/00; H01L 2924/00014; H01L 2224/48247; H01L 2224/48091; H01L 2224/32245; H01L 23/49503; H01L 2924/01079; H01L 2924/14; H01L 2924/01029; H01L 2924/151; H01L 2924/1511; H01L 2924/1515; H01L 2924/15165; H01L 2924/152; H01L 2924/181; H01L 2924/18301; H01L 23/16; H01L 23/28; H01L 23/49861; H01L 21/52; H01L 21/56; H01L 21/565; H01L 21/67126; H01L 21/67144; H01L 2021/6027
USPC ........................ 257/676, 678, 687, 696, 787
See application file for complete search history.

(56) References Cited

U.S. PATENT DOCUMENTS

| 5,367,191 | A  | * | 11/1994 | Ebihara ..................... 257/666 |
| 5,578,871 | A  | * | 11/1996 | Fierkens ..................... 257/676 |
| 6,025,640 | A  | * | 2/2000  | Yagi et al. .................. 257/666 |
| 6,046,496 | A  | * | 4/2000  | Corisis et al. .............. 257/675 |
| 6,075,284 | A  | * | 6/2000  | Choi et al. ................. 257/676 |
| 6,101,101 | A  | * | 8/2000  | Tzu et al. ................... 361/808 |
| 6,188,130 | B1 | * | 2/2001  | Ramirez et al. ............. 257/706 |
| 6,297,543 | B1 | * | 10/2001 | Hong et al. ................. 257/666 |
| 6,303,985 | B1 | * | 10/2001 | Larson et al. ............... 257/676 |
| 6,476,469 | B2 | * | 11/2002 | Hung et al. ................. 257/676 |
| 6,724,071 | B2 | * | 4/2004  | Combs ....................... 257/666 |
| 6,777,788 | B1 | * | 8/2004  | Wan et al. ................... 257/670 |

(Continued)

FOREIGN PATENT DOCUMENTS

| EP | 533137 A2 * | 3/1993 | ............ H01L 23/495 |
| JP | 60137041 A * | 7/1985 | .............. H01L 23/28 |

(Continued)

*Primary Examiner* — Teresa M Arroyo
(74) *Attorney, Agent, or Firm* — Mauriel Kapouytian Woods LLP; Ararat Kapouytian

(57) ABSTRACT

Provided is a lead frame package with stand-off legs to prevent the die attach pad (DAP), which is part of the package substrate, to tilt or shift from its original position during the molding process. Also provided are methods for assembling such lead frame packages into various integrated circuit (IC) packages. Compared to conventional lead frame packages without stand-off legs, the lead frame packages of the present invention have less aesthetic and functional defects, thereby leading to an increase in product reliability and yield.

18 Claims, 9 Drawing Sheets

(56) References Cited

U.S. PATENT DOCUMENTS

| | | |
|---|---|---|
| 7,087,986 B1 * | 8/2006 | Bayan et al. ............. 257/676 |
| 7,944,032 B2 * | 5/2011 | Bayan ..................... 257/670 |
| 8,330,270 B1 * | 12/2012 | Lin et al. ................ 257/723 |
| 2002/0140064 A1 * | 10/2002 | Wu et al. ................. 257/670 |
| 2003/0006055 A1 * | 1/2003 | Chien-Hung et al. ..... 174/52.1 |
| 2006/0138620 A1 * | 6/2006 | Yagi ....................... 257/676 |
| 2007/0176271 A1 * | 8/2007 | Trasporto et al. ......... 257/676 |
| 2008/0073763 A1 * | 3/2008 | Jungsuwadee ............ 257/676 |

FOREIGN PATENT DOCUMENTS

| | | | | |
|---|---|---|---|---|
| JP | 01122143 A | * | 5/1989 | ........... H01L 23/50 |
| JP | 02130862 A | * | 5/1990 | ........... H01L 23/50 |
| JP | 04163951 A | * | 6/1992 | ........... H01L 23/50 |
| JP | 05095077 A | * | 4/1993 | ........... H01L 23/50 |
| JP | 05129513 A | * | 5/1993 | ........... H01L 23/50 |
| JP | 05243474 A | * | 9/1993 | ........... H01L 23/50 |
| JP | 06132443 A | * | 5/1994 | ........... H01L 23/50 |

* cited by examiner

200

INTEGRATED CIRCUIT PACKAGE WITH STAND-OFF LEGS

BACKGROUND

This invention relates generally to integrated circuit (IC) packages, and specifically to leadframe packages and corresponding methods for their assembly.

The forming of IC packages usually require molding equipment that encapsulates an IC die in a mold compound (for example, epoxy resin) to protect it from environmental factors such as dust, heat, moisture, static electricity, and mechanical shocks. The leadframe is the foundation of the molded IC package. The two most common leadframe metals employed by the industry are nickel-iron alloy and copper alloy.

A leadframe package may use a wire bond package substrate for mounting an IC die. In a wire bond package substrate, wire bond connections provide the electrical paths for power and signal distribution from the package substrate to an IC die. Lead fingers connect the IC package to other IC packages or the printed circuit board. A wire bond package substrate typically comes with a die-attach pad (DAP) for mounting the die.

Typically, a mold set used in a molding equipment to assemble IC packages has two halves—a top half and a bottom half. These opposing halves open to receive the package substrate, and close during the molding cycle. Opposing halves that have been mated together during the molding cycle form mold cavities. Gates are small openings into these cavities through which the mold compound is injected.

Unpredictable variations in the molding process, composition of the mold compound, and the molding equipment itself sometimes cause the mold compound to flow at different rates into the top and bottom cavities of a mold set. The uneven flow of mold compound often cause the DAP to tilt or shift from its original position, resulting in an exposed DAP, exposed wires, stressed wires, package breaks, cracks, or device failures. The appearance of exposed DAP or wires on the surface of the package is also aesthetically undesirable. Functional failures or cosmetic defects tend to become more significant during the formation of slim packages such as Quad Flat Pack (QFP), Thin QFP (TQFP), and Low-profile QFP (LQFP) packages or during the formation of packages with stacked or multiple dice. In slim and stacked-die packages, the cavities for the flow of mold compound are smaller; thus, these packages are more susceptible to failures or defects caused by imbalances in the mold flow.

One type of leadframe package is shown in FIG. 1, which shows a cross-sectional view of a typical leadframe package 100. A leadframe package substrate 102 includes a DAP 104 and corresponding lead fingers 106 disposed about DAP 104. During assembly of leadframe package 100, die 108 is mounted onto DAP 104 with an adhesive (e.g., die attach epoxy). Die 108 is then electrically connected to lead fingers 106 using wire bond connections 112. Generally, DAP 104 is sized to support die 108. In one embodiment, DAP 104 is sized to include a surface area larger than that of die 108. As such, an exposed portion of DAP 104 is available around the attached die 108. Molding cap 110, which is made out of molding compound, is formed over die 108, DAP 104, wire bond connections 112, and at least a portion of lead fingers 106. The other portion of lead fingers 106 is left extending outside of molding cap 110 to establish communication with other components, for example, a printed circuit board, when the IC package is mounted onto the printed circuit board.

The injection of mold compound into an IC package during the molding process can lead to several undesirable effects in conventional IC packages. For example, an imbalanced mold flow can cause one side of the DAP to tilt downwards and the other side of the DAP to tilt upwards. The tilting of the DAP increases the height of one side of the DAP relative to the floor of the mold cavity, resulting in disproportionate vertical heights for the tilted sides of the DAP relative to the floor. An imbalanced mold flow may occur, for example, when the mold compound flows faster into one side of the mold cavity compared to the other side.

During the molding process, the flow of mold compound into the mold cavity depends on several process parameters such as the preheat time of the molding equipment, mold temperature, mold transfer pressure, and the speed of mold flow. Even a slight variation in the process parameters may cause an imbalanced mold flow, which in turn may cause the DAP to tilt or move. As such, to prevent the DAP from tilting or moving, the window for variation in the process parameters must be kept small and meticulously adhered to.

FIG. 2 shows leadframe package 200 where DAP 204 is tilted to one side of the leadframe package. As shown in FIG. 2, the tilting of DAP 204 causes die 208 that is mounted onto DAP 204 to tilt as well. Furthermore, wire bond connections 212 are stressed and might protrude out of molding cap 210 or break apart if the degree of tilting increases. Stressed wire bond connections 212 may result in unreliable or loss of connectivity between the die and the lead fingers.

FIG. 3 shows leadframe package 300 where DAP 304 is exposed through floor 314 of the mold cavity and wire bond connection 312 is exposed through molding cap 310 of the mold cavity. As shown in FIG. 3, the tilting of DAP 304 causes wire bond connection 312 to extend upwards and protrude out of the upper surface or ceiling of the molding cap 310. The tilting also causes one side of DAP 304 to extend downwards and protrude out of the lower surface or floor 314 of the mold cavity. When viewed as an assembled product, part of wire bond connection 312 will be visible at the top surface of the leadframe package, while part of DAP 304 will be visible on the bottom surface of the package. A package such as that shown in FIG. 3 will not only be rejected due to cosmetic flaws, but may also cause reliability and quality issues in the functionality of the package.

The tilting or shifting of DAP in a package substrate causes physical defects in IC packages, leading to the scrapping of the affected packages and subsequently an increase in the costs of manufacturing. Some tilting may cause physical defects that are visible to the naked eye, while some tilting may cause physical defects that are hard to detect visually or through electrical tests. Nonetheless, the performance of the IC package can be substantially affected or altered by the physical defects caused by a tilting DAP even though they are not visually detectable.

The use of multiple or stacked dice increases the occurrence of DAP tilting. For example, as more than one die is stacked above the DAP, the space that is available for the mold compound to flow during the molding process decreases. With the decrease in space, the speed at which the mold compound flows also decreases, thereby increasing the risk of imbalanced mold flow. Thus, the probability of the DAP tilting or shifting from its original position also increases. Thinner IC packages are also susceptible to DAP tilting because the reduced vertical height also reduces the speed of mold compound flow. Therefore, the severity or frequency of DAP tilting increases in stacked-die and thin IC packages. Stacked-die and thin IC package components are typically more expensive than standard components, making the cost of physical defects in these packages even more prohibitive than in standard packages.

SUMMARY

Embodiments of the present invention provide a leadframe package with stand-off legs to prevent the DAP from tilting or shifting and thus, result in significantly less IC packages being damaged during the molding process. The embodiments of the present invention also provide methods for assembling such leadframe packages.

In one embodiment, an IC package includes a package substrate with a DAP and a plurality of lead fingers arranged around the DAP. A die is mounted on the DAP and a plurality of stand-off legs are connected to the DAP. The IC package also includes a mold compound covering the die, at least a portion of the package substrate, and at least a portion of the plurality of stand-off legs.

In one embodiment, an IC package includes a package substrate with a DAP and a plurality lead fingers arranged around the DAP. The DAP also includes a plurality of stand-off legs arranged at its periphery. Each stand-off leg is connected at one end to a bottom surface of the DAP and at the other end to the floor of the mold cavity. The height of each stand-off leg is substantially equal to the height between the DAP and the floor of the mold cavity. Each stand-off leg is placed on the floor such that the top surface of the DAP remains substantially parallel to the floor. A die is mounted on the DAP and a plurality of wire bond connections electrically connect the die to the plurality of lead fingers around the DAP. There is also a mold compound covering the die, the plurality of wire bond connections, and at least a portion of the package substrate.

In one embodiment, a method of assembling an IC package includes the steps of (1) forming a package substrate, which includes a DAP and a plurality of lead fingers arranged around the DAP and extensions projecting out from the periphery of the DAP; (2) down-setting the DAP relative to the plurality of lead fingers; (3) bending the extensions of the DAP to form the stand-off legs.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
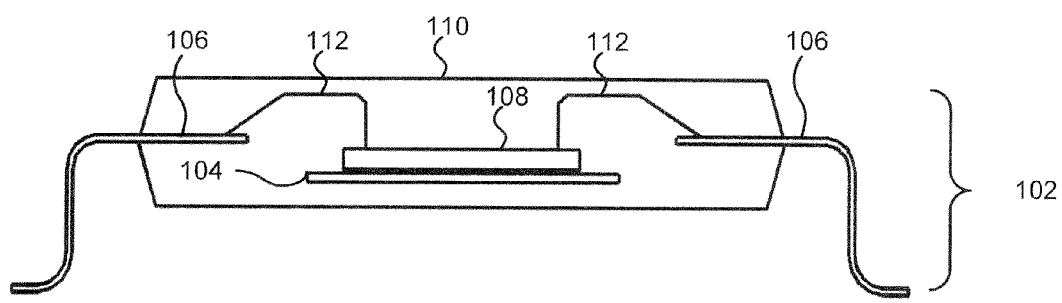
FIG. 1 shows a cross-sectional view of a typical leadframe package.
Figure 2:
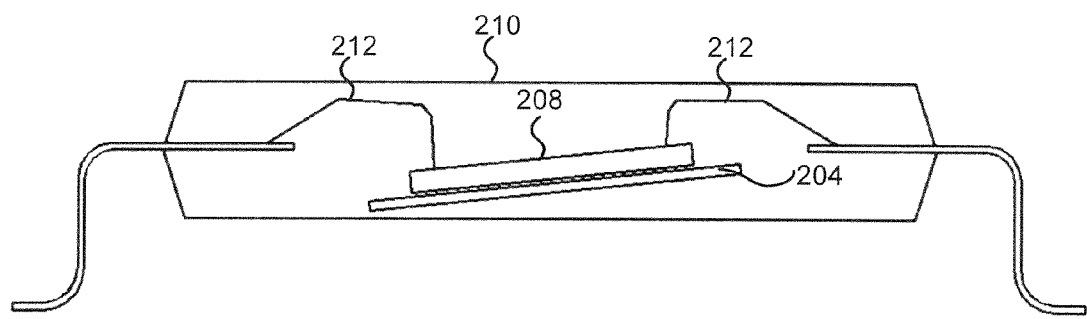
FIG. 2 shows a cross-sectional view of a leadframe package where the DAP is tilted to one side of the leadframe package.
Figure 3:
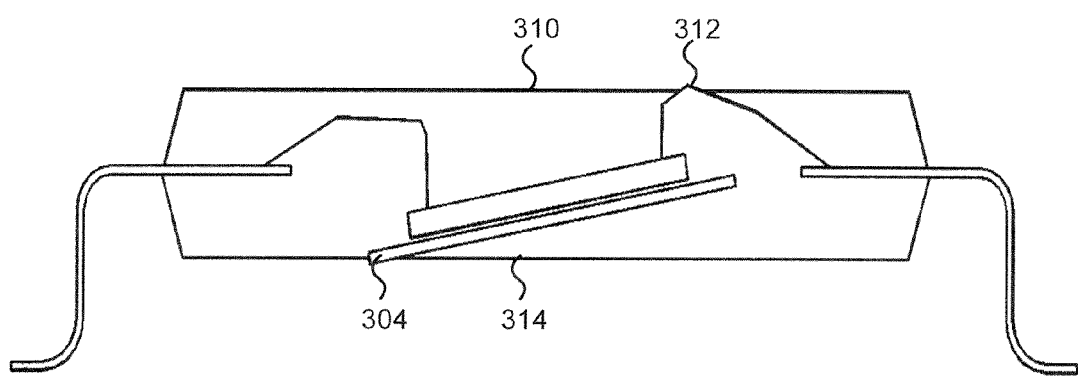
FIG. 3 shows a cross-sectional view of a leadframe package where the DAP is exposed through the floor of the mold cavity and a wire bond connection is exposed through the top surface of the mold cavity.
Figure 4:
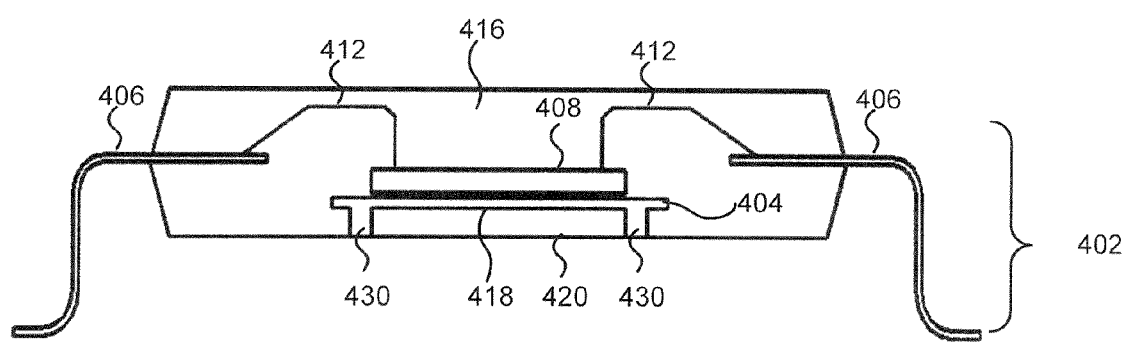
FIG. 4 shows a side view of an assembled leadframe package according to one embodiment of the present invention.

FIG. 4 shows a side view of assembled leadframe package 400 according to one embodiment of the present invention. Leadframe package 400 includes several components: die 408, package substrate 402, wire bond connections 412, and mold cavity 416. In one embodiment, package substrate 402 includes DAP 404, stand-off legs 430, and lead fingers 406. All the components are configured for assembling together. For example, during the package assembly process, die 408 sits on DAP 404, which in turn sits on stand-off legs 430, which is on floor 420 of mold cavity 416. Package 400 includes wire bond connections 412 for connecting die 408 to lead fingers 412. DAP 404 can be of any shape or size, but will generally be bigger than die 408 and have exposed portions around the die. The mold compound, when injected into mold cavity 416, will completely cover die 408 and partially cover package substrate 402, including stand-off legs 430. In one embodiment, the mold compound does not cover the bottom surface of stand-off legs 430. In another embodiment, the mold compound entirely covers stand-off legs 430, including their bottom surfaces.

Stand-off legs 430 are coupled at one end to bottom surface 418 of DAP 404 and at the other end to floor 420 of mold cavity 416. Stand-off legs 430 are arranged around the periphery of DAP 404. As such, stand-off legs 430 secure DAP 404 to floor 420 of mold cavity 416 so that the top surface of DAP 404 remains substantially parallel to floor 420. With stand-off legs 430, when the mold compound is injected into mold cavity 416, the flow of the mold compound will not cause DAP 404 to tilt or shift. In other words, DAP 404 will remain substantially parallel to the floor even after the mold compound is injected into the mold cavity. This ensures DAP 404 does not tilt or shift. A tilted or shifted DAP might affect the reliability and quality of the leadframe package.

Figure 5:
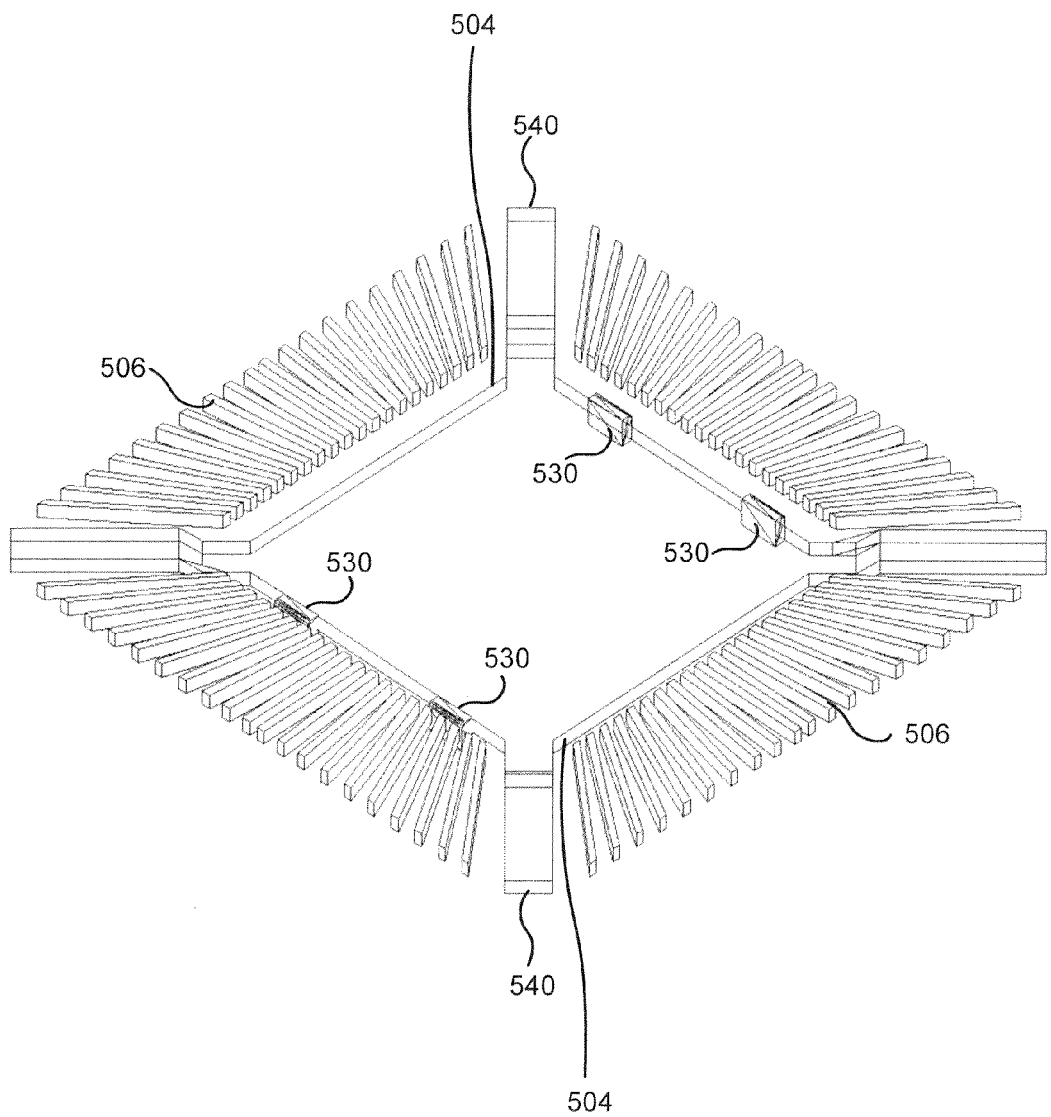
FIG. 5 shows a perspective isometric view of a package substrate according to one embodiment of the present invention.

FIG. 5 shows a perspective isometric view of package substrate 500 according to one embodiment of the present invention. In one embodiment, package substrate 500 includes DAP 504, stand-off legs 530, tie bars 540, and lead fingers 506. In one embodiment, stand-off legs 530 and tie bars 540 are directly connected to DAP 504. In one specific embodiment, stand-off legs 530 are directly connected to DAP 504 and contiguous with the periphery of DAP 504. In one embodiment, there are at least three stand-off legs 530 supporting DAP 504. In FIG. 5, the number of stand-off legs shown is four, although more may be used, if necessary. A larger DAP usually has more stand-off legs. In FIG. 5, each stand-off leg 530 is bent at a substantially perpendicular angle relative to the bottom surface of DAP 504.

To fabricate the package substrate, any conductive material (e.g., copper alloy) may be used. As shown in FIG. 5, package substrate 502 has DAP 504 arranged such that it is surrounded by lead fingers 506 and attached to tie bars 540. DAP 504 may also be arranged so that it is lower than lead fingers 506 as shown in FIG. 5. This arrangement is commonly referred to as a "down-set" DAP.

According to one embodiment, the minimum vertical height of each stand-off leg is 100 micrometers while the maximum vertical height of each stand-off leg is 1700 micrometers. In one embodiment, the vertical height of each stand-off leg is not more than the vertical height between the bottom surface of the DAP and the floor of the mold cavity.

According to one embodiment, each stand-off leg is a rectangular column. The columnar or three-dimensional shape of the stand-off legs provides a contact area between the DAP and stand-off legs to support the weight of the DAP. Although rectangular columns are proposed in the embodiment, it should be appreciated by one skilled in the art that other three-dimensional or columnar shapes can also be used as stand-off legs as long as the DAP can be supported without tilting or shifting.

Figure 6:
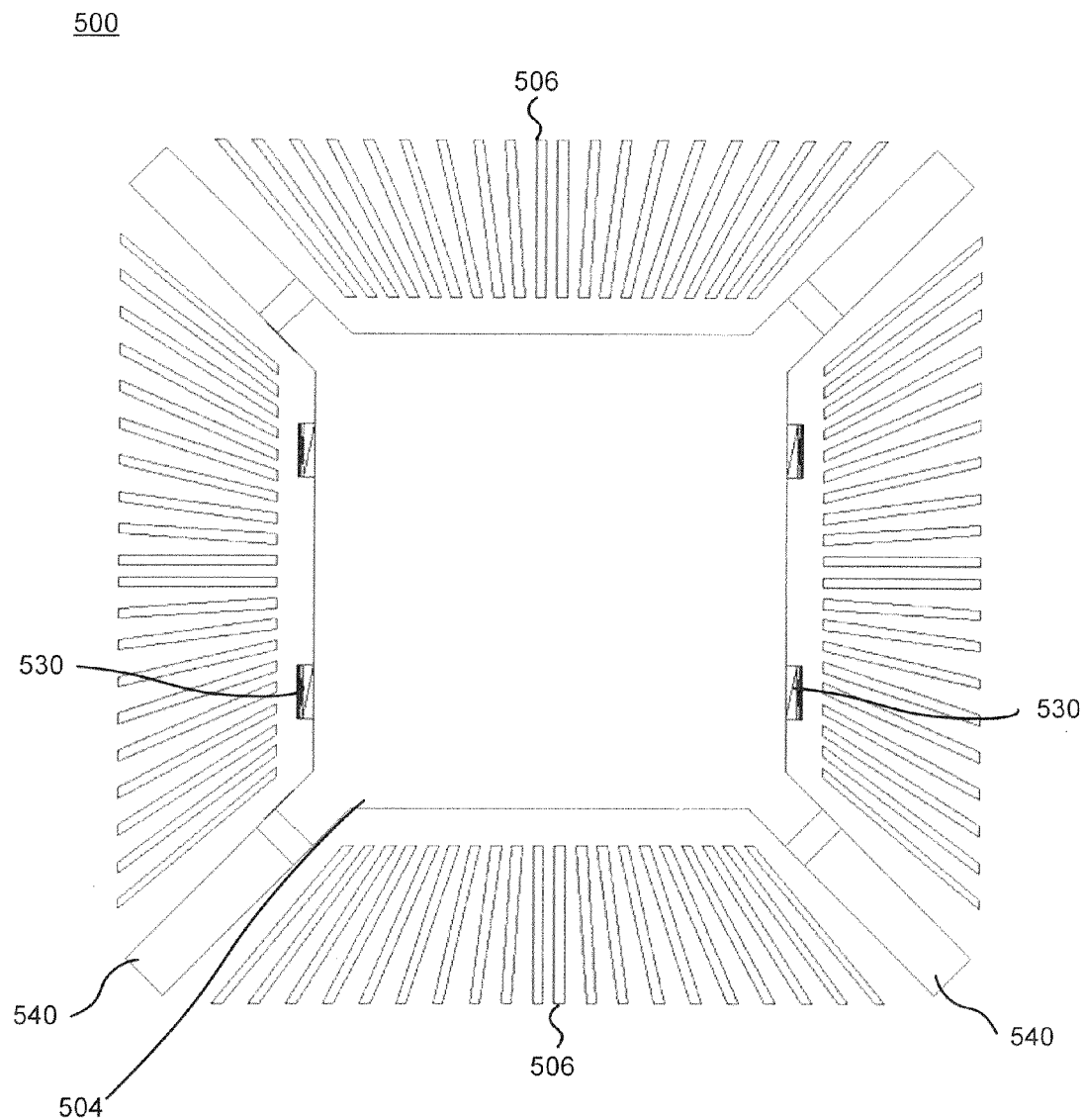
FIG. 6 shows a top view of the package substrate of FIG. 5.

FIG. 6 shows a top view of package substrate 500 of FIG. 5. Package substrate 500 includes DAP 504, stand-off legs 530, tie bars 540, and lead fingers 506. Stand-off legs 530 and tie bars 540 are directly connected to DAP 504, whereas lead fingers 506 are connected to DAP 504 with wire bond connections. The number of stand-off legs shown in FIG. 6 is four. However, a person skilled in the art will appreciate that the number of stand-off legs used may vary with the size and shape of the DAP. A bigger DAP usually has more stand-off legs, whereas some DAPs can be supported with fewer legs.

Figure 7:
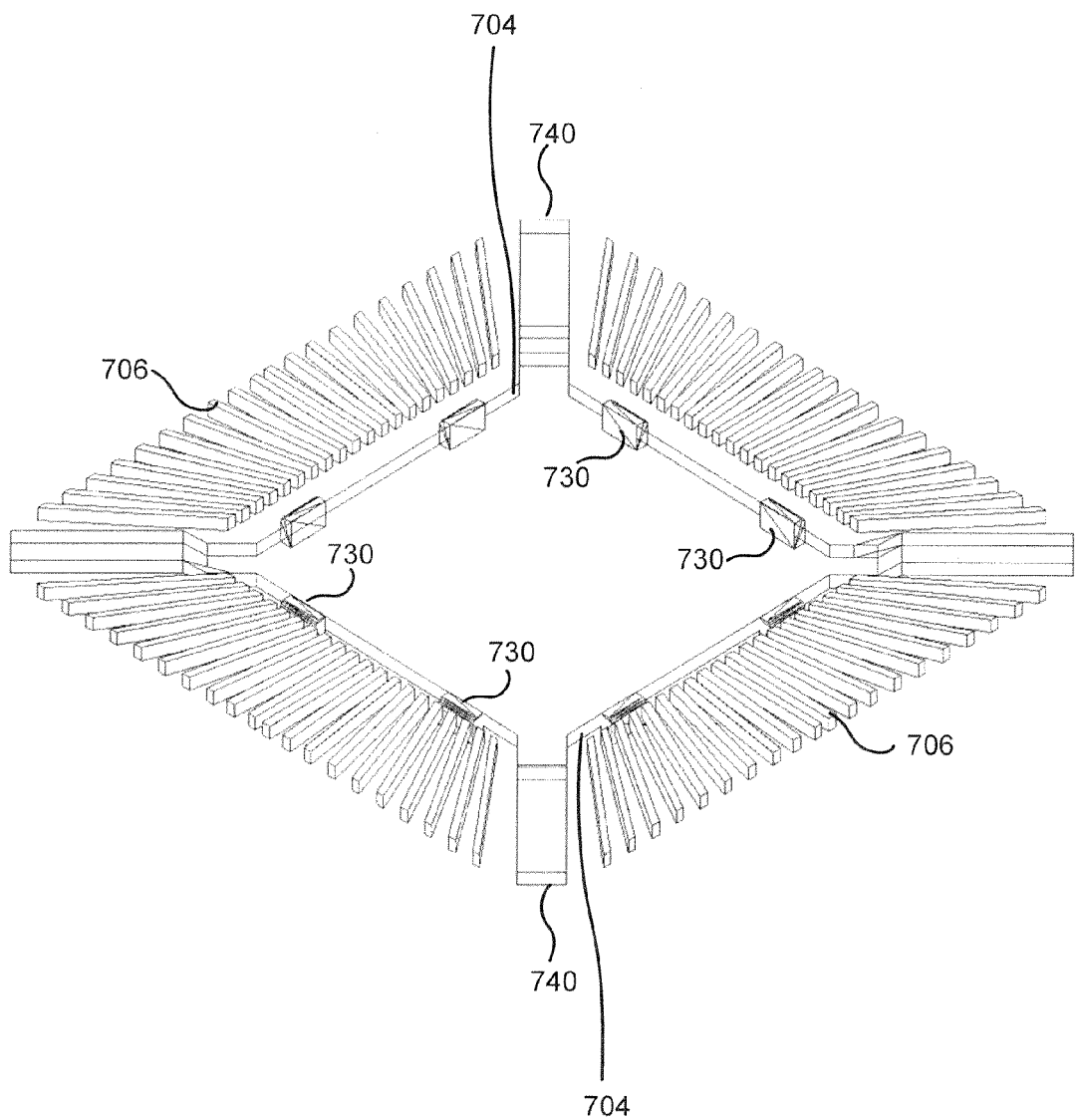
FIG. 7 shows a perspective isometric view of a package substrate according to another embodiment of the present invention.

FIG. 7 shows a perspective isometric view of package substrate 700 according to another embodiment of the present invention. In one embodiment, package substrate 700 includes DAP 704, stand-off legs 730, tic bars 740, and lead fingers 706. In one embodiment, stand-off legs 730 and tie bars 740 are directly connected to DAP 704. In one specific embodiment, stand-off legs 730 are directly connected to DAP 704 and contiguous with the periphery of DAP 704. In one embodiment, there are at least three stand-off legs 730 supporting DAP 704. In FIG. 7, the number of stand-off legs shown is eight, although more may be used, if necessary. A larger DAP usually has more stand-off legs. In FIG. 7, each stand-off leg 730 is bent at a substantially perpendicular angle relative to the bottom surface of DAP 704.

Figure 8:
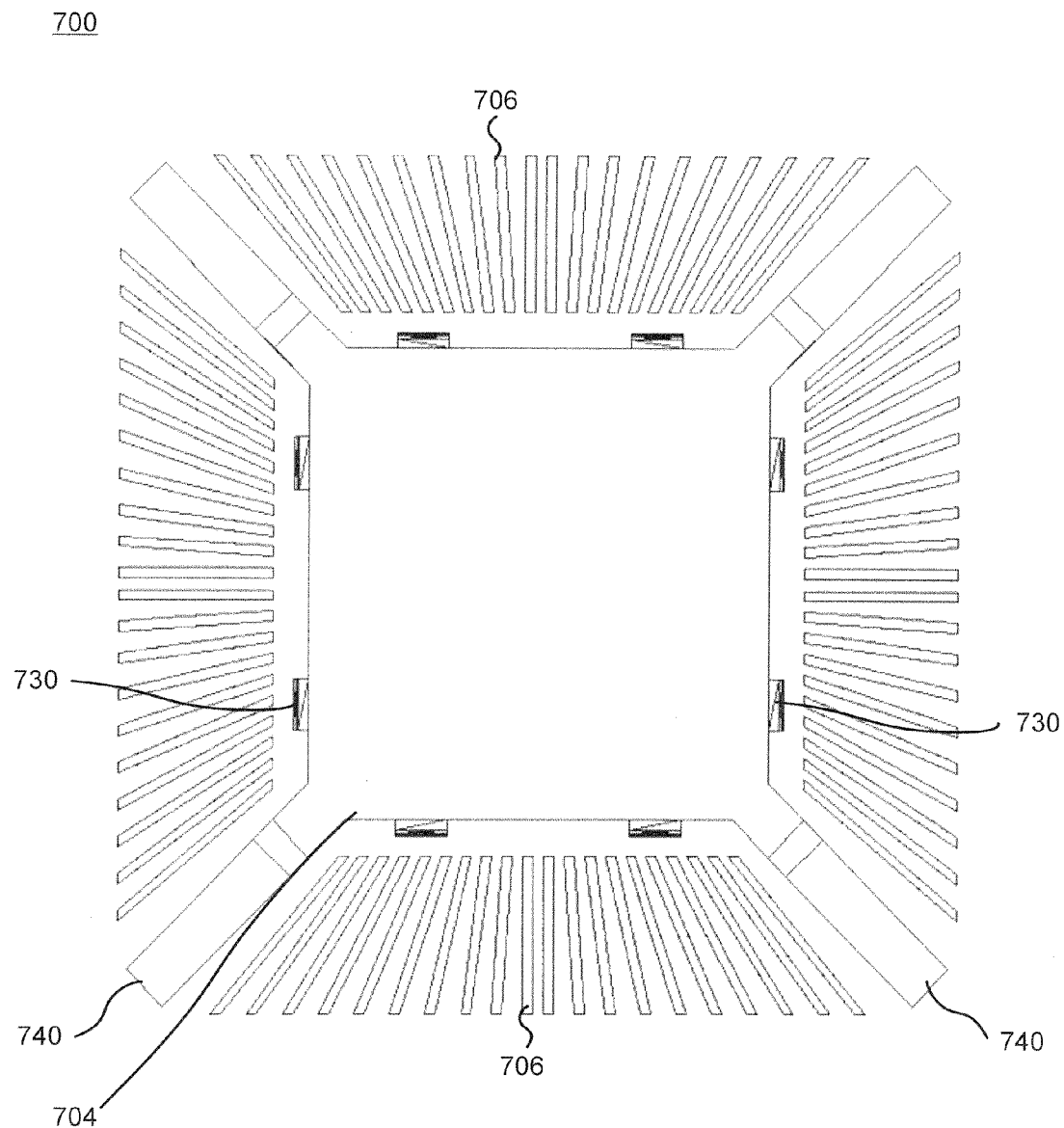
FIG. 8 shows a top view of the package substrate of FIG. 7.

FIG. 8 shows a top view of package substrate 700 of FIG. 7. Package substrate 700 includes DAP 704, stand-off legs 730, tic bars 740, and lead fingers 706. Stand-off legs 730 and tie bars 740 are directly connected to DAP 704, whereas lead fingers 706 are connected to DAP 704 with wire bond connections. The number of stand-off legs shown in FIG. 8 is eight. However, a person skilled in the art will appreciate that the number of stand-off legs used may vary with the size and shape of the DAP. A bigger DAP usually has more stand-off legs, whereas some DAPs can be supported with fewer legs.

Figure 9:
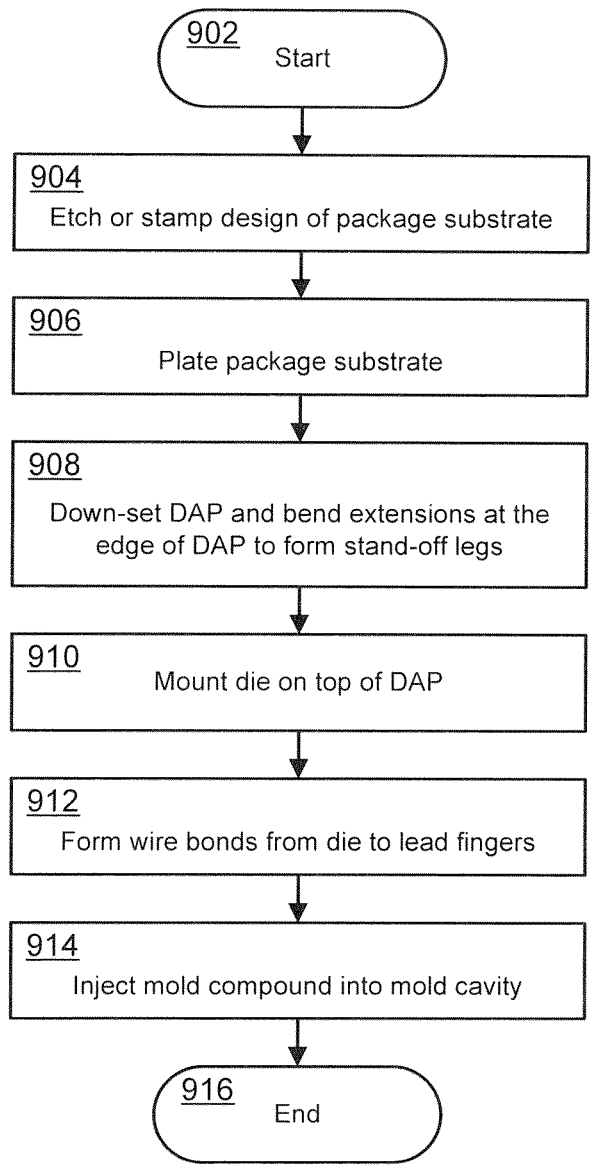
FIG. 9 shows a flow diagram of forming a leadframe package according to one embodiment of the present invention.

The IC packages described in the present invention may be assembled using any number of methods. FIG. 9 shows a flow diagram 900 of forming a leadframe package according to one embodiment of the present invention. The flow diagram 900 starts at 902. At 904, the etching and stamping of the package substrate is performed. Any package substrate (e.g., 500 and 700) can be used for this purpose. Any conventional etching or stamping process may be used. For example, in the etching process, photolithography is used to transfer the image of the package substrate design onto a metal sheet. At 906, the package substrate is plated to inhibit corrosion. The metal used for plating is usually gold, even though other types of non-corrosive metal can also be used. The package substrate includes the DAP, stand-off legs, tie bars, and lead fingers. In one embodiment, the stand-off legs are contiguous extensions at the periphery of the DAP. For example, for a package substrate with four stand-off legs, there will be four extensions at the periphery of the DAP. Next, at 908, the package substrate is formed. The forming of the package substrate includes bending each of the contiguous extensions at the periphery of the DAP at a substantially perpendicular angle to the edge of the DAP to form stand-off legs. The stand-off legs enable the DAP to stand on and remain substantially parallel to the floor of the mold cavity when the mold compound is injected into the mold cavity. Next, mounting a die to the package substrate is performed at 910. The die may be mounted to the DAP with die attach epoxy. Further, at 912, wire bonds are connected from the die to the package substrate via lead fingers. Any conventional wire bonding process may be used. At 914, the package substrate is placed in a mold cavity whereby a mold compound is injected. The mold compound will cover the die and at least a portion of the package substrate. Finally, process 900 ends at 916. As will be appreciated by persons of ordinary skill in the art, some of the process operations of process 900 may be reordered or eliminated.

One advantage of having stand-off legs is that the position of the DAP is maintained relative to the floor of the mold cavity during the assembly of the leadframe package. Therefore, when mold compound is injected into the mold cavity, the DAP will not tilt or move. A tilted DAP may distort the position of the wire bond connections in the leadframe package or cause the wire bond connections to protrude from the top surface of the mold cavity. Such abnormalities may result in unreliable or unpredictable function of the package. Another advantage of having stand-off legs is in improved manufacturability for the leadframe package. For example, a faster flow of mold compound can be injected into the mold cavity without affecting the position of the DAP, thereby leading to a reduction in manufacturing time. Yet another advantage is in yield increase for the leadframe package as there will be fewer defects in the assembled products. Overall, embodiments of the invention can shorten production turnaround time, increase production yield, and improve product reliability when implemented. During the molding process, embodiments of the invention can also provide for a wider variation in the process parameters such as the mold temperature, mold transfer pressure, and speed of mold flow. For example, the speed of mold flow can be increased without causing the DAP to tilt or move.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:
1. An integrated circuit (IC) package comprising:
  a package substrate including a die attach pad (DAP) and a plurality of lead fingers arranged around the DAP;
  a die mounted on the DAP;
  a plurality of stand-off legs connected to the DAP; and
  a mold compound covering the die, at least a portion of the package substrate, and at least a portion of the plurality of stand-off legs, wherein portions of the DAP directly above the plurality of stand-off legs have flat surfaces, further wherein the mold compound covers bottom surfaces of the plurality of stand-off legs, wherein each stand-off leg is coupled at one end to a bottom surface of the DAP and at the other end to a floor of the mold compound, further wherein a vertical height of each stand-off leg is substantially equal to a vertical height between the DAP and the floor of the mold compound, and further wherein the bottom surfaces of the plurality of stand-off legs are flat, and wherein the plurality of stand-off legs includes at least two stand-off legs connected to a first side of the DAP and at least two stand-off legs connected to a second side of the DAP.

2. The IC package of claim 1, wherein a top surface of the DAP is substantially parallel to the floor of the mold compound.

3. The IC package of claim 2, wherein each stand-off leg is contiguous with the DAP and is substantially perpendicular to the bottom surface of the DAP.

4. The IC package of claim 1, wherein the DAP has the plurality of stand-off legs at its periphery.

5. The IC package of claim 1, wherein the plurality of stand-off legs includes at least two stand-off legs connected to a third side of the DAP and at least two-stand off legs connected to a fourth side of the DAP.

6. The IC package of claim 1, wherein the DAP is down-set relative to the plurality of lead fingers.

7. The IC package of claim 1, wherein the die is smaller than the DAP such that a periphery of the DAP is exposed around the die.

8. The IC package of claim 1, wherein a minimum vertical height of each stand-off leg is 100 micrometers.

9. The IC package of claim 1, wherein a maximum vertical height of each stand-off leg is 1700 micrometers.

10. The IC package of claim 1, wherein the package substrate and stand-off legs are composed of a copper alloy.

11. The IC package of claim 1, wherein each stand-off leg is a rectangular column.

12. The IC package of claim 1 further comprising a plurality of wire bond connections electrically connecting the die to the plurality of lead fingers.

13. An integrated circuit (IC) package, comprising:
a package substrate, the package substrate having a die attach pad (DAP) and a plurality of lead fingers arranged around the DAP, the DAP including a plurality of stand-off legs at its periphery;
a die mounted on the DAP;
a plurality of wire bond connections electrically connecting the die to the plurality of lead fingers; and
a mold compound covering the die, the plurality of wire bond connections, and at least partially the package substrate,
wherein each stand-off leg is connected at one end to a bottom surface of the DAP and at the other end to a floor of the mold compound, and a height of each stand-off leg is substantially equal to a height between the DAP and the floor, and a top surface of the DAP is substantially parallel to the floor, further wherein portions of the DAP directly above the plurality of stand-off legs have flat surfaces, further wherein the die is not electrically coupled to the plurality of stand-off legs, and further wherein bottom surfaces of the plurality of stand-off legs are flat, and wherein the plurality of stand-off legs includes at least two stand-off legs at a first side of the DAP and at least two stand-off legs at a second side of the DAP.

14. The IC package of claim 13, wherein each stand-off leg is contiguous with the DAP and is substantially perpendicular to the bottom surface of the DAP, further wherein the mold compound does not cover the bottom surfaces of the plurality of stand-off legs.

15. An integrated circuit (IC) package comprising:
a package substrate including a die attach pad (DAP);
a die mounted on the DAP;
a plurality of stand-off legs connected to the DAP; and
a mold compound covering the die, at least a portion of the package substrate, and at least a portion of the plurality of stand-off legs,
wherein portions of the DAP directly above the plurality of stand-off legs have flat surfaces, further wherein the die is not electrically coupled to the plurality of stand-off legs,
wherein each stand-off leg is coupled at one end to a bottom surface of the DAP and at the other end to a floor of the mold compound, wherein a top surface of the DAP is substantially parallel to the floor of the mold compound, further wherein the mold compound does not cover bottom surfaces of the plurality of stand-off legs, and further wherein the bottom surfaces of the plurality of stand-off legs are flat, and
wherein the plurality of stand-off legs includes at least two stand-off legs connected to a first side of the DAP and at least two stand-off legs connected to a second side of the DAP.

16. The IC package of claim 15, wherein each stand-off leg is contiguous with the DAP and is substantially perpendicular to a bottom surface of the DAP.

17. The IC package of claim 15 further comprising a plurality of wire bond connections, wherein the package substrate further comprises a plurality of lead fingers arranged around the DAP, wherein the plurality of wire bond connections electrically connect the die to the plurality of lead fingers, and further wherein the mold compound covers the wire bond connections.

18. The IC package of claim 17, wherein the DAP is down-set relative to the plurality of lead fingers.

* * * * *